United States Patent [19]

Harrison et al.

[11] 4,300,096

[45] Nov. 10, 1981

[54] IMAGING SYSTEMS

[75] Inventors: Colin G. Harrison, High Wycombe; Ian R. Young, Sunbury on Thames, both of England

[73] Assignee: EMI Limited, Hayes, England

[21] Appl. No.: 39,649

[22] Filed: May 16, 1979

[30] Foreign Application Priority Data

May 25, 1978 [GB] United Kingdom ............... 22295/78

[51] Int. Cl.$^3$ ...................... G01N 27/00; G01N 24/08
[52] U.S. Cl. .................................................. 324/309
[58] Field of Search ........................................ 324/309

[56] References Cited

U.S. PATENT DOCUMENTS

| | | |
|---|---|---|
| 3,778,614 | 12/1973 | Hounsfield . |
| 3,789,832 | 2/1974 | Damadian .......................... 324/309 |
| 3,924,129 | 12/1975 | Gordon . |
| 3,932,805 | 1/1976 | Abe .................................... 324/309 |
| 4,015,196 | 3/1977 | Moore ............................... 324/309 |
| 4,021,726 | 5/1977 | Garroway .......................... 324/309 |
| 4,070,611 | 1/1978 | Ernst ................................. 324/309 |

OTHER PUBLICATIONS

Proton Spin Imaging by Nuclear Magnetic Resonance, Mansfield, Contemp. Phys., 1976, vol. 17, No. 6, pp. 553-576.

Design and Performance of YIG-Tuned Gunn Oscillators, Easson, The Microwave Journal, Feb. 1971, pp. 53-58 and 68.

Ka-Band YIG-Tuned GaAs Oscillator, Zublin et al, The Microwave Journal, Sep. 1975, pp. 33-35 and 50.

Primary Examiner—Michael J. Tokar
Attorney, Agent, or Firm—Fleit & Jacobson

[57] ABSTRACT

Nuclear magnetic resonance (NMR) apparatuses have been proposed to examine slices or volumes of bodies, perhaps patients for medical purposes, by exciting resonance and detecting the resonance signals.

In an NMR apparatus an $G_R$ field gradient, for selecting lines within a slice or volume, is formed of Gx and Gy components. These should match exactly in shape if not in magnitude. In practice this is difficult to achieve and it is proposed to monitor these fields and derive error signals for their deviation from each other or from a standard. The error signals are used to reduce the deviations so that continuous adjustment of the fields is provided.

16 Claims, 17 Drawing Figures

IMAGING SYSTEMS

The present invention relates to systems for providing images of distributions of a quantity, in a chosen region of a body, by gyromagnetic resonance particularly nuclear magnetic resonance (NMR) techniques. Such techniques may be used for examining bodies of different kinds. However a particularly beneficial application is the examination of patients for medical purposes.

Nuclear magnetic resonance is known for the analysis of materials, particularly by spectroscopy. Recently it has been suggested that the techniques be applied to medical examination to provide distributions of water content or relaxation time constants in sectional slices or volumes of patients. Such distributions are similar to, although of different significance from, the distributions of x-ray attenuation provided by computerised tomography (CT) systems.

Practical NMR systems operate by applying suitable combinations of magnetic fields to the body being examined, via coil systems, and detecting induced currents in one or more detector coil systems. A suitable sequence of pulsed magnetic fields has been devised to achieve accurate and rapid examination. However satisfactory operation of the sequence depends on providing fields which precisely conform to desired conditions.

It is an object of this invention to provide suitable precision of an important magnetic field component.

According to the invention there is provided an NMR apparatus, for examining at least one slice of a body, the apparatus including means for applying magnetic fields to cause resonance preferentially in said slice, means for applying a pulsed magnetic field having a gradient across said at least one slice to produce phase dispersion in said resonance, and means for sensing, during the application of said gradient field, the resonance signal induced, wherein the gradient field is caused to have a gradient in different directions in the slice at different times by varying proportions of two component magnetic fields with orthogonal gradients, the apparatus further including means for sensing the magnetic fields at a plurality of positions in the plane of the slice, means for deriving therefrom error signals indicative of differences between the fields measured in two orthogonal directions and those fields required to provide the gradient magnetic field of a desired magnitude in a desired direction, and means for using the error signals to adjust the component fields to their required values.

In order that the invention may be clearly understood and readily carried into effect it will now be described by way of example with reference to the accompanying drawings, of which:

FIG. 9 shows in detail the nature of the correction, FIG. 10 corresponds to FIG. 7 for a different $G_R$ pulse.

For the examination of a sample of biological tissue NMR primarily relates to protons (hydrogen nuclei) of water molecules in the tissue. In principle however, other nuclei could be analysed. Suitable nuclei include Tritium, Deuterium, Fluorine and Phosphorus.

The nuclei each have a nuclear magnetic moment and angular momentum (spin) about the magnetic axis. If then a steady magnetic field is applied to the sample the nuclei align themselves with the magnetic field, most being parallel thereto and some being anti parallel so that the resultant spin vector is parallel to the field axis. For this examination procedure the steady field is aligned with an axis of the system which will be identified as the z-axis. The field is now identified as $H_{zo}$ where all fields aligned with the z-axis are identified as $H_z$.

The nuclei have a characteristic frequency (known as the Larmor frequency) which is determined by the local value of the steady magnetic field, i.e. $H_{zo}$. Application of an additional field $H_1$, which is an R.F. field at the Larmor frequency in a plane normal to $H_{zo}$, causes resonance at that frequency so that energy is absorbed in the sample. The resultant spin vectors of nuclei in the sample then rotate from the magnetic field axis (z-axis) towards a plane orthogonal thereto (x,y). The R.F. field is generally applied as a pulse and if $\int H_1 dt$ for that pulse is just sufficient to rotate the resultant spin vectors through 90° into the x, y plane the pulse is termed a 90° pulse.

On removal of the $H_1$ field the equilibrium alignments re-establish themselves with a time constant $T_1$, the spin-lattice relaxation time. In addition a proportion of the absorbed energy is re-emitted as a signal which can be detected by suitable coils, at the resonant frequency. This resonance signal decays with a time constant $T_2$ and the emitted energy is a measure of (for protons) the water content of the sample.

As so far described the resonance signal detected relates to the entire sample. If individual resonance signals can be determined for elemental samples in a slice or volume of a patient then a distribution of proton densities or, in effect, water content can be determined for that slice or volume. Additionally or alternatively it is possible to determine a distribution of $T_1$ or $T_2$.

In general the principles of analysing proton density by NMR in a slice of a body have been extensively discussed. The known techniques have been reviewed by P. Mansfield in Contemp. Phys. 17 (6) 1976, 553–576. Consequently the techniques will only be discussed in detail herein to the extent necessary to understand the improved arrangement of this invention.

In the embodiment discussed herein the examination is particularly of a cross-sectional slice of the patient, although examination of a larger volume is possible at least by examination of a plurality of adjacent slices, or by a specifically volume scan.

Figure 1:
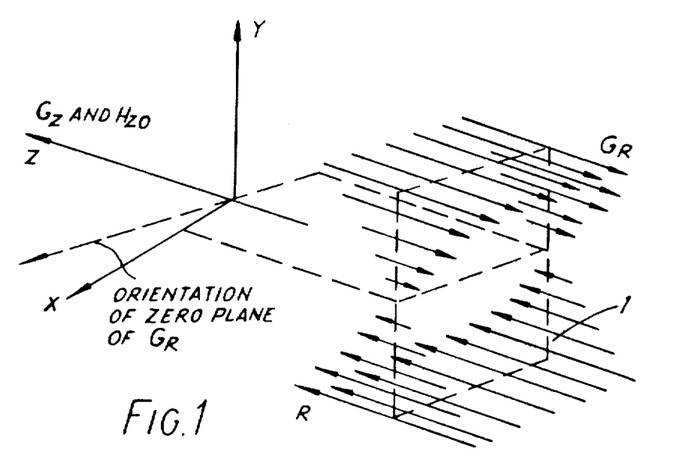
FIG. 1 shows the form of the $G_R$ field gradient.
Figure 2:
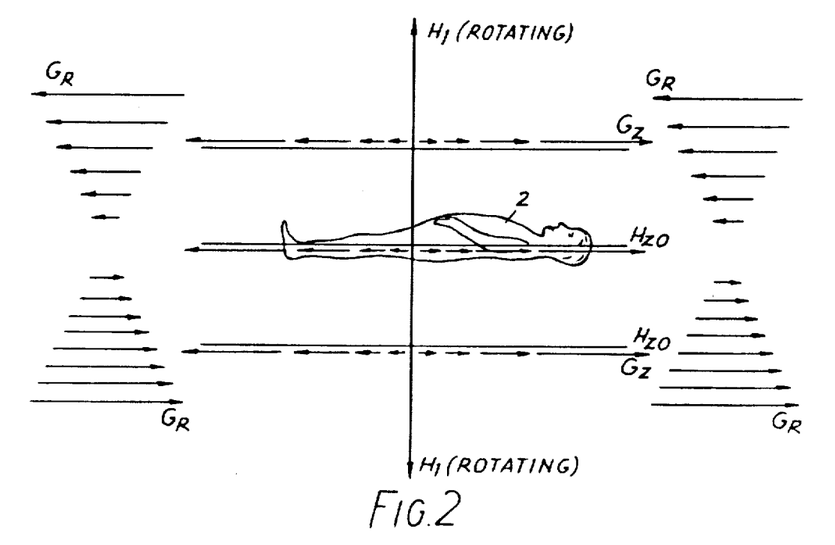
FIG. 2 shows the relationship of the $G_R$ field gradient to the other field.

The first step is to ensure as far as possible that resonance occurs (at the chosen frequency) only in the selected slice. Since the resonance frequency (the Larmor frequency) is related to the value of the steady magnetic field, the slice selection is achieved by imposing a gradient on $H_{zo}$ so that the steady field is of different magnitude in different slices of the patient. The steady and uniform $H_{zo}$ field is applied as before, usually longitudinal to the patient. An additional magnetic gradient field $G_z$ is also applied $G_z = \partial H_z/\partial z$. If then the pulsed $H_1$ field is applied at the appropriate frequency, resonance only occurs in that slice in which the resonance frequency, as set by $H_{zo}$ and the local value of $G_z$, is equal to the frequency of $H_1$. It the $H_1$ pulse is a 90° pulse, it brings the spin vectors into the x,y plane substantially only for the resonant slice. Since the value of the field is only significant during the $H_1$ pulse it is only necessary that $G_z$ be applied when $H_1$ is applied and in practice $G_z$ is also pulsed. The $H_1$ and $G_z$ fields are therefore then removed. It is still, however, possible to change the resonant frequencies of the spin vectors which are now in the x,y plane. This is achieved by applying a further gradient field $G_R$ ($G_R = \partial H_z/\partial R$) which is parallel to $H_{zo}$. The intensity of $G_R$ however, varies from a maximum at an extreme of the slice, through zero in the centre to a maximum in the reverse direction on the opposite surface. The $G_R$ field is illustrated in FIG. 1, the arrows indicating only magnitudes at points on a rectangle 1. There will of course be a smooth variation through and between the magnitudes illustrated. The fields are also illustrated diagrammatically in the side elevation of FIG. 2 in relation to a patient 2. Correspondingly the resonant frequencies will vary smoothly across the slice from one side to the other.

As mentioned before, the signal which now occurs is at the resonant frequency. Consequently the signals received from the slice will also have frequencies which vary across the slice in the same manner. The amplitude at each frequency then represents inter-alia, the proton density in a corresponding strip parallel to the zero plane of $G_R$. The amplitude for each strip can be obtained by varying the detection frequency through the range which occurs across the slice. Preferably however the total signal at all frequencies is measured. This is then Fourier analysed by well known techniques to give a frequency spectrum. The frequency appropriate to each strip will be known from the field values used and the amplitude for each frequency is given by the spectrum.

As discussed, for the gradient field $G_R$ illustrated in FIG. 1, the individual signals derived from the frequency spectrum, for increments of frequency, correspond to incremental strips parallel to the zero plane of $G_R$. These signals are similar in nature to the edge values derived and analysed for x-ray beams in computerised tomography. The x-ray edge values are obtained for sets at a plurality of different orientations in an examined slice and then are processed by a suitable method, such as that described in U.S. Pat. No. 3,778,614 and the further development thereof described in U.S. Pat. No. 3,924,129.

It will be apparent that by changing the orientation, relative to the x,y plane, of the zero plane of $G_R$ further sets of signals can be obtained representing proton densities along lines of further sets of parallel lines at corresponding further orientations in the examined slice. The procedure is therefore repeated until sufficient sets of "edge values" have been derived to process by methods like those used in CT for sets of x-ray beams. In practice the $G_R$ field gradient is provided by combination of two field gradients $G_x$ and $G_y$, which are both parallel to $H_{zo}$ but have gradients in orthogonal directions. The direction of the gradient of the resultant $G_R$ is therefore set by the relative magnitudes of $G_x$ and $G_y$. At many points in the following description reference will be made to the creation of $G_R$ field pulses and it should be remembered, even where $G_x$ and $G_y$ field gradients are not individually discussed that reference is to the resultant of $G_x$ and $G_y$ field pulses.

Figure 3A:
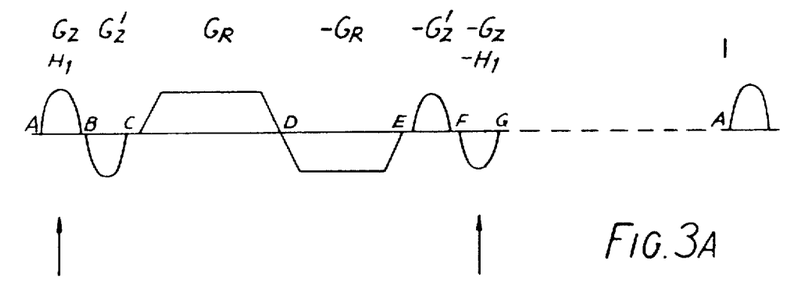
FIG. 3a shows the preferred field pulse sequence.
Figure 3B:
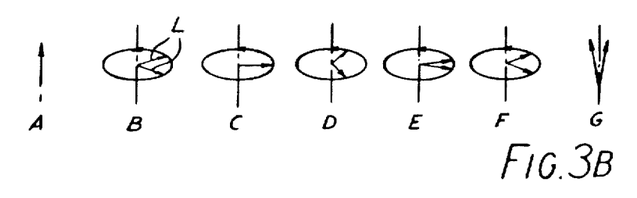
FIG. 3b shows the effects of the pulses of FIG. 3a on the proton spin vectors.

The full examination for one direction of the $G_R$ gradient is achieved by applying, via appropriate coils, the sequence of field pulses shown in FIG. 3a. FIG. 3b shows the effect which each pulse has on the spin vector. It will be realised that the $H_1$ field is a rotating field about the z-axis. In the absence of $H_1$ the spin vectors precess about the z-axis. For clarity of explanation the spin vectors are shown in FIG. 3b on a coordinate system which rotates with $H_1$.

Referring to FIGS. 3a and 3b together, the pulse cycle comprises six phases, AB to FG, and a recovery period shown by the broken line. The field $H_{zo}$ is continuously present throughout the cycle.

Prior to the first pulse, or after the recovery period if an earlier cycle has been implemented, the mean spin moments are substantially aligned with the z-axis (A).

The gradient field $G_R$ pulse and $H_1$ pulses (AB), simultaneously applied, respectively select the slice and bring the resultant spin moments into the x, y plane (still, of course, processing about the z-axis). Although the exciting frequency is the same throughout the slice selected, there is a phase dispersion introduced because the excitation occurred in a field gradient. Thus the spin moments are as shown at B, though dispersed between limits much greater than can be conveniently illustrated. Those shown at L are merely indicative of the nature of the dispersion. It has been found that this phase dispersion can be reversed by the application of a negative field gradient pulse, that is a pulse of the correct relative magnitude as $G_z$ but 180° displaced (in practice the magnitude is typically 57% of that of $G_z$). This pulse BC is therefore applied to bring the spin moments in the x y plane into phase as at C. The $H_1$ field need not be continued into the negative gradient pulse ($G_z'$) but it can be continued during that pulse if required to ensure that the spin moments go down to the x y plane.

At that time a signal could be sensed to give proton density for the whole slice. However in this sequence the signal is sensed in the presence of a $G_R$ pulse CD which gives frequency dispersion in a selected direction (R) in the slice as previously described. The change to the new frequencies is almost instantaneous with the application of the $G_R$ pulse and is maintained proportionately throughout the pulse. As discussed the signal is sensed and frequency analysed to give the proton densities for a plurality of parallel relatively displaced strips of the slice. After the $G_R$ pulse the spin moments, which are still largely in the x, y plane despite some relaxation, have a considerable phase dispersion as shown at D (which, as mentioned is merely illustrative since the actual dispersion is $n\pi$ where n exceeds 100). At that stage, if a further cycle as described so far were to be required, it would be necessary to wait for spin-lattice relaxation to realign the spin moments with the z-axis. This could take as much as 5 seconds which, since several hundreds or even several thousands of cycles are required, is much too long.

It is proposed to return the spin moments substantially back to the starting position (A) by repeating the pulse sequence up to D in the reverse order and reverse sense. Since the $-G_R$ pulse is substantially the same as the $G_R$ pulse except for its sense, further signals may be sensed during it. These will be for the same r direction as for the forward pulse and help to improve the signal to noise ratio.

After the reverse pulse sequence the spin moments still show deviation from the z-axis due to phase dispersion caused by spin-spin coupling. This can not be reversed by this pulse sequence nor, it is believed, by any other. The period GA therefore allows some relaxation to thermal equilibrium (time constant $T_1$) which eliminates the effects of the phase dispersion and also reduces the effects of any mismatching between the forward and reverse pulses. Although the relaxation period GA is still necessary, the use of the reversed pulse sequence D to G has much reduced that period and allows faster repetition of the total sequence for other R-directions.

The length of the signal measurement period CE is determined by the phase dispersion caused by $H_{zo}$ field inhomogeneity and also by the dispersion caused by spin-spin coupling. If the effect of $H_{zo}$ field inhomogeneity is considered to excessively shorten the period CE then pulse FG may be a 180° r.f. pulse rather than a 90° pulse. Turning the spin moments through 180° produces a so-called "spin-echo" of known form and the $G_R$ pulses similar to CD and DE can be repeated to give a further signal measurement period. The spin-echo procedure is known to reverse the dispersion due to field inhomogeneity and can be repeated here several times until sufficient signal has been obtained or until spin-spin dispersion, which cannot be reversed, becomes excessive. As in the sequence of FIG. 3A, a spin-echo sequence should end with pulses EF, FG and recovery period GA.

The ratio of period GA to period AG should preferably be approximately the ratio of $T_1$ to $T_2$ for maximum sensitivity. Typically the total period AGA is 40 m sec when AG is approximately 5.5 m sec, AB is 300 μsec and CD is 2 m sec. The $H_1$ pulse is typically of 0.6 Oe and has a frequency of 4.26 MH$_z$ for an $H_{zo}$ of 1000 Oe. All other pulses are at envelope frequency $G_z$ being typically +30 Oe to −30 Oe (peak), $G_R$ being 15 Oe to −15 Oe at the edges of the slice.

In the preferred embodiment $G_z'$ is less than $G_z$; typically $\int G_z' dt = 0.55 \int G_z dt$ to $0.6 \int G_z dt$ although it may be a larger proportion, perhaps $0.8 \int G_z dt$.

This pulse sequence is the subject of the U.S. Patent application corresponding to British Patent Application No. 22291/78.

Figure 4A:
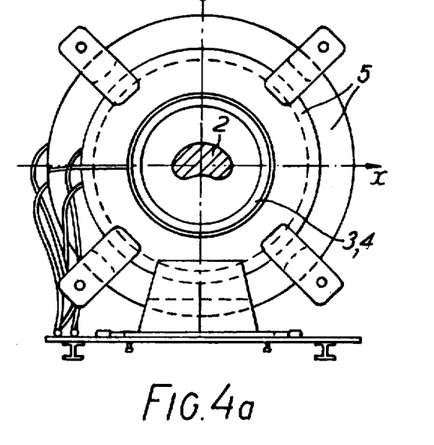
FIG. 4a, 4b and 4c show in three views the $H_{zo}$, $G_X$ and $G_y$ field coils of a practical NMR machine.
Figure 4B:
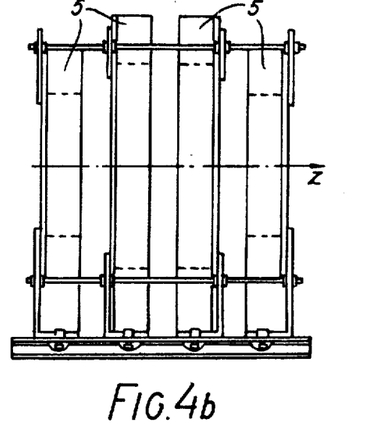

FIGS. 4a and 4b show in end and side elevation respectively a practical coil arrangement to provide the $H_{zo}$ field. FIG. 4a also shows the coils for production of the $G_R$ field pulses and, to show approximate dimensions, the patient 2 in cross-section. The patient 2 is inserted in the tubular former of $G_R$ coils 3, 4 and is supported there by a suitable couch or other supporting means. Such supports may be readily provided in any suitable form.

The coils 3, 4 are two sets of coils axially displaced, each set comprising two pairs of saddle coils the pair 3 being at 90° to the pair 4. These coils are themselves inserted into the central aperture in $H_{zo}$ coils 5 which are wound in four parts connected in series to provide an approximately circular configuration which is well known to be desirable for production of a uniform field.

Figure 4C:
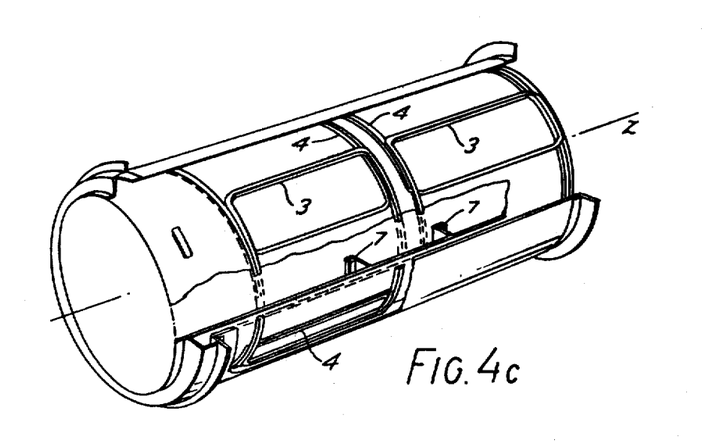

FIG. 4c is a partially cut-away perspective view which shows the coils 3, 4 in more detail. Also visible in the cut-away are the two circular coils 7 which provide the $G_z$ field component for the gradient superimposed on $H_{zo}$.

Figure 5:
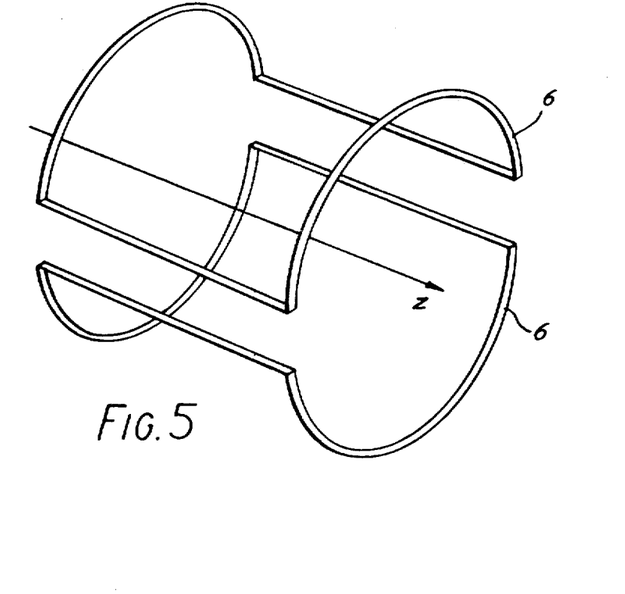
FIG. 5 shows the $H_1$ field coils of that machine.

The $H_1$ coils are shown in FIG. 5 in perspective. They are two saddle shaped coils 6 which are driven in parallel to provide the rotating $H_1$ field and which are also used to detect the signals which are of approximately the same frequency.

Figure 6:
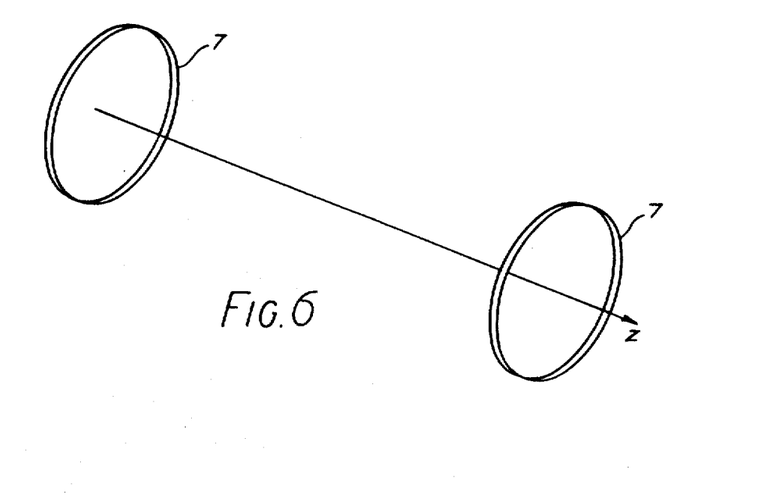
FIG. 6 shows the $G_Z$ field coils of that machine.

FIG. 6 shows, also in perspective, a complete view of the two circular coils 7 which provide the $G_z$ field component.

Further details of the coil winding will not be given since suitable coils can readily be devised, by those with the appropriate skills, to provide the fields required.

Also included in the coil system are a set of field measurement probes whose purpose will be discussed further hereinafter, four of these are yttrium iron garnet tuned oscillators (so-called YIG oscillators) and a fifth and sixth are simple NMR probes.

Figure 7:
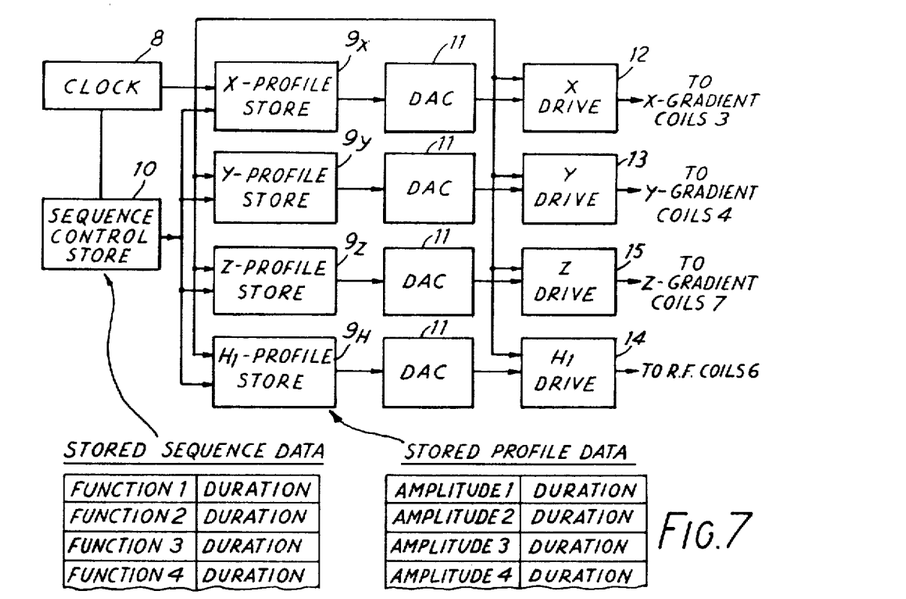
FIG. 7 is a block diagrammatic circuit for controlling the pulse sequence.

In FIG. 7 there is shown a block diagram of a suitable system for controlling a pulse sequence such as that discussed hereinbefore. A clock 8 generates clock pulses for control of the system and supplies pulses to other units as shown. Four profile stores $9_x$, $9_y$, $9_z$, and $9_H$ respectively store the pulse shapes for the $G_x$, $G_y$, $G_z$ and $H_1$ pulses, these being stored as a sequence of current amplitudes in digital form and associated with each amplitude, also in digital form, the duration, in terms of number of clock pulses, for which each amplitude is required.

The operation of the four profile stores 9 is controlled by a sequence control store 10 which stores in similar manner a sequence of commands to operate the profile stores and the duration (number of clock pulses) of operation of each stage of the sequence, including gaps in the sequence. Stores 9 and 10 are conveniently programmable read only memories (PROM's).

When commanded by a central (operator) control (not shown in FIG. 7) the sequence control store initiates the first pulse profile store, which as will be realised from description of the pulse sequence is for $H_1$ and $G_z$ pulses. The appropriate stores 9 provide the amplitude and duration signals which are converted to analogue form in digital to analogue converters (DAC's) 11 and applied to respective coil drive circuits 12(x), 13(y), 14($H_1$) and 15(z). The respective drive circuits, which can take any form well known for driving field coils, provide the specified current to the appropriate coil for the specified duration.

The NMR apparatus described so far can be constructed by those with experience in this art to provide the required data for a slice of a patients body. For sufficiently accurate results to give diagnostically useful information it is, however, desirable, and in some cases important, that factors, in particular the magnetic fields, are precisely controlled. For example it is desirable that the $H_{zo}$ field should be uniform to around 2 parts in $10^6$ over the examined slice. This uniformity can be affected by the quality of the coils used and by adjacent ferromagnetic materials, which should therefore be kept to a minimum.

Also requiring great precision are the gradient fields, which as discussed before are constructed from $G_x$ ($=G_R \sin \theta$) and $G_Y (=G_R \cos \theta)$ pulses. The $G_R$ gradient vector should be in the desired direction with the least error possible. Furthermore the $-G_R$ pulse should reproduce, in the opposite sense, the preceding $G_R$ pulse. It is the production of the required precision of $G_R$ with which this invention is concerned. To achieve this it is proposed to provide a continuously operative control system, responsive to field sensitive probes disposed within the coil systems, to respond to changes in the measured field, relative to the field precalculated as desirable, and to make appropriate corrections.

The system can be operated in two ways. One of the $G_X$ or $G_Y$ pulses can be matched to the other to maintain the $G_R$ vector as desired. Preferably that for which $\int Hdt$ is greater is matched to that for which it is lower. Alternatively both can be matched to a standard curve.

Using a model of a suitable pulse, the field measurements to be obtained by sampling at the chosen times can be calculated. In practice it is convenient to choose sample times such that the field samples are spaced at equal increments of $\int Hdt$. The times at which these samples are expected are therefore stored in the controlling circuits.

If samples are taken at these predetermined times then the difference between the calibrated value of $\int Hdt$ and the value of $\int Hdt$ actually sampled is an error signal E. Alternatively it can be convenient to sample when the predetermined field integrals are reached and record the time of sampling. In that case the basic error signal is the difference between the time at which a particular sample was expected and the time at which it was actually measured by the field probe system.

It should be noted that it is only possible to make corrections later in each cycle for errors which have already occurred. The errors may, however, be stored and used for precorrections on a later cycle.

The $G_R$ pulses themselves may take different forms as preferred by those setting up the equipment. In one preferred form they would be square gradient pulses although this is not possible in practice for engineering reasons. However the invention may be implemented with any desired pulse shape, which can be provided in practice, by calculating field integrals at chosen times.

Figure 8:
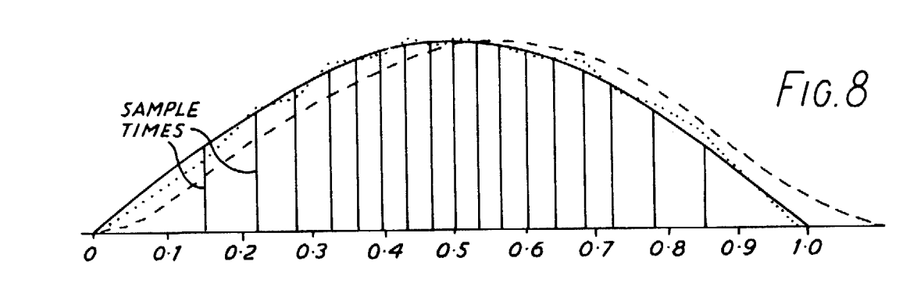
FIG. 8 shows a $G_R$ pulse and the nature of the correction required.

One suitable pulse is a half sine wave, $I=I_o \sin\omega t$, such as shown in FIG. 8 by the solid line. The accumulation of spin phase counts ($\phi$) in the field measurement probes follows the time integral of this field $$\phi = I_o(1-\cos\omega t)$$

In a practical implementation, because of corrections and adjustments which do not form part of this invention, the real gradient pulses are distorted half sine waves such as is shown in FIG. 8 by the broken line. This distorted form can satisfactorily be used provided the pulses are matched to each other or both matched to the chosen shape. For the purposes of this description, however, it will be assumed that matching is to be to the ideal half sine wave.

Figures 9, 10:
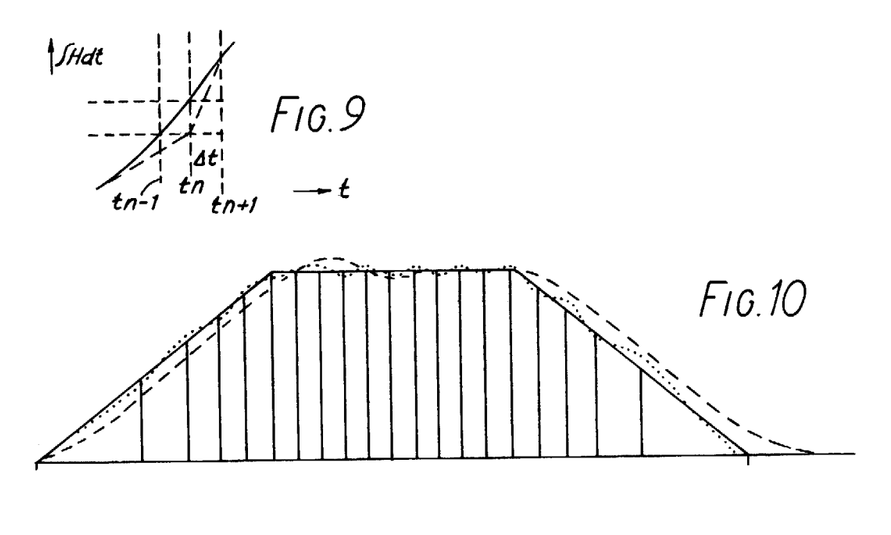

It is desired to correct the field errors as they appear and thus to prevent their accumulation. Thus the measured $\int Hdt$ is to be brought back to the calibrated $\int Hdt$ during the interval $\Delta t$ between $t_n$, at which the sample was taken and $t_{n+1}$, which is the next sample time. The error E has units of ampere seconds and the correction is by injection of a current $I_c$ into the field coils during the time $\Delta t = t_{n+1} - t_n$. The desired effect is shown in FIG. 9 in a plot of $\int Hdt$ against t. The effect of making this running correction throughout the field pulse is shown in FIG. 8 by the dotted line. It has been mentioned that other field pulses can be used and FIG. 10, for which the solid, broken and dotted lines have the same significance as in FIG. 8, shows another shape.

It will be realised that, for making the corrections, the current in the inductor cannot be changed instantaneously. It is therefore necessary to inject a voltage such that the time integral of the current change corrects the error. The current required is determined on the assumption that current injection is possible.

In practice for $\Delta t < 2$ms, $d\phi/dt = I_o \sin \omega t$ and is almost linear.

The linear gradient required to bring $\phi$ real back to $\phi$ calibrated in $\Delta t$ is:

$$\frac{d\phi}{dt} \text{ real} = \frac{\frac{I_o}{\omega}(\cos\omega t_n - \cos\omega t_{n+1}) + E}{\Delta t}$$

$$= I_o \sin\omega t_n + \frac{E}{\Delta t}$$

so the required correction current is $I_c = E/\Delta t$ during the interval $\Delta t$.

That is, an injection of charge $\delta C = E$ (Ampere seconds).

There are many possible errors, depending on the method of pulse generation. If the method is a high power sinusoidal source two of the most frequent sources of error are a change in the pulsed field duration and a charging voltage error. The first change can be about 1% and the second should not be greater than 0.1%. Calculations then show that the errors are of the order of $1-2 \times 10^{-6}$ Ampere seconds where $\Delta t \sim 50\mu s$.

If $L = 6$mH for a typical coil then
$V_C$ is of the order of 10V.

The correction includes three features:
(i) to correct the waveform to its calibrated (not the ideal) shape
(ii) to correct errors, at least in part, as they appear, to avoid accumulation,
(iii) to apply a fixed correction between sample times.

The acceptable error is given by the requirement to control the spin phase to $\pm 0.1$ radian. The total phase change is $128 \times 2\pi$ radians or 800 radians, so the maximum acceptable error is $E = (0.1/800)(I_o/\omega) = 16.10^{-6}$ A.S.

Figure 11:
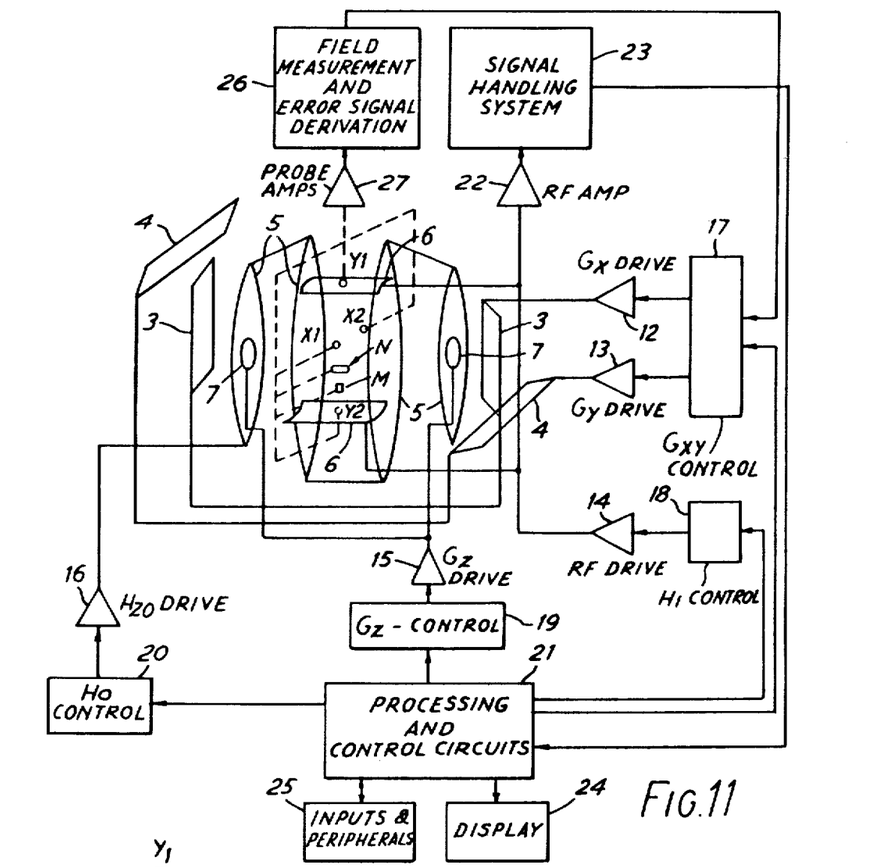
FIG. 11 shows a block diagram of the complete NMR apparatus.

FIG. 11 shows in simplified form an NMR apparatus, suitable for medical examination, employing the pulse sequence explained with reference to FIG. 3a and including the field control of this invention for determination of the $G_R$ pulses.

The coils 3, 4, 5, 6 and 7, which are shown schematically, are those shown hereinbefore in FIGS. 4 to 6. They are driven by the $G_X$, $G_Y$, RF ($H_1$) and $G_Z$ drive circuits 12, 13, 14 and 15 shown in FIG. 7 and $H_{ZO}$ drive circuit 16 respectively, controlled by $G_{XY}(G_R)$, $H_1$, $G_Z$ and $H_{ZO}$ control circuits, 17, 18, 19 and 20 respectively. These circuits can take suitable forms which will be known to those with experience of NMR equipment and other apparatus using coil induced magnetic fields. The circuits, which include stores 9 of FIG. 7, are controlled by circuits 21, which include store 10 of FIG. 7, to achieve the pulse sequence described or another appropriate one.

The signal sensed during the $G_R$ pulses is detected in the $H_1$ coils 6 and is amplified by an RF amplifier 22 before being applied to signal handling circuits 23. Circuits 23 are arranged to make any appropriate calibrations and corrections but essentially transmit the signals, which are effectively proton density values for lines in the body, to processing circuits to provide the required representation. These circuits can be specially designed to implement the CT type processing as described and claimed in U.S. Pat. No. 3,924,129. However it is advantageous to implement the processing by a suitably programmed digital computer. This computer can also conveniently control the pulse sequence and thus effectively provide the circuits indicated at 21. The picture thus obtained is viewed on a display 24, such as a television monitor, and this may include inputs and other peripherals 25 for the provision of commands and instructions to the machine or other forms of output.

Thus far described the machine is essentially a variation of known types of NMR apparatus, arranged to implement the new pulse sequence described hereinbefore.

Further to this however, and to implement the invention, it includes field measurement and error signal circuits 26 which receive signals via amplifiers 27 from the field probes $X_1$, $X_2$, $Y_1$, $Y_2$, N and M shown. The positions of the probes, in relation to the examined slice of body 2, is further shown in FIG. 12. $X_1$, $X_2$ are the field sensitive probes referred to hereinbefore and are in this example YIG (yttrium-iron-garnet) tuned oscillator probes. These are standard magnetic field measuring probes such as described in R.M. Easson (The Microwave journal, Feb. 1971 pp 53–58 and 68) or by Zublin et al. (The Microwave journal, Sep. 1975 pp 33.35 and 50). These probes provide measures of the fields at the points at which they are situated as oscillations of field-proportional frequency (2.8 MHz/Oe). The values measured are therefore obtained by a count of the oscillations in a set time. In practice the YIG probes can oscillate in different modes and it is necessary to determine the mode in operation. For this purpose there are provided NMR probes M & N.

Figure 12:
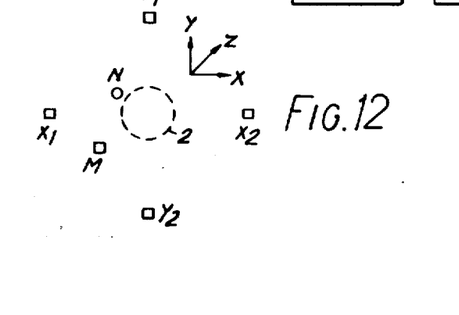
FIG. 12 shows the disposition of the field sensing probes used.

These probes are simply miniature cells of pure water (such as a closed test tube) surrounded by a small coil. They give a reliable resonance of 4.26 kHz/$O_e$ and can be used to check the YIG tuned oscillator modes. Probe N, fixed in space, acts as a reference. A movable NMR probe M may be moved adjacent the YIG probes in turn to provide data to determine their modes of oscillation, orientation and other characteristics.

Figure 13:
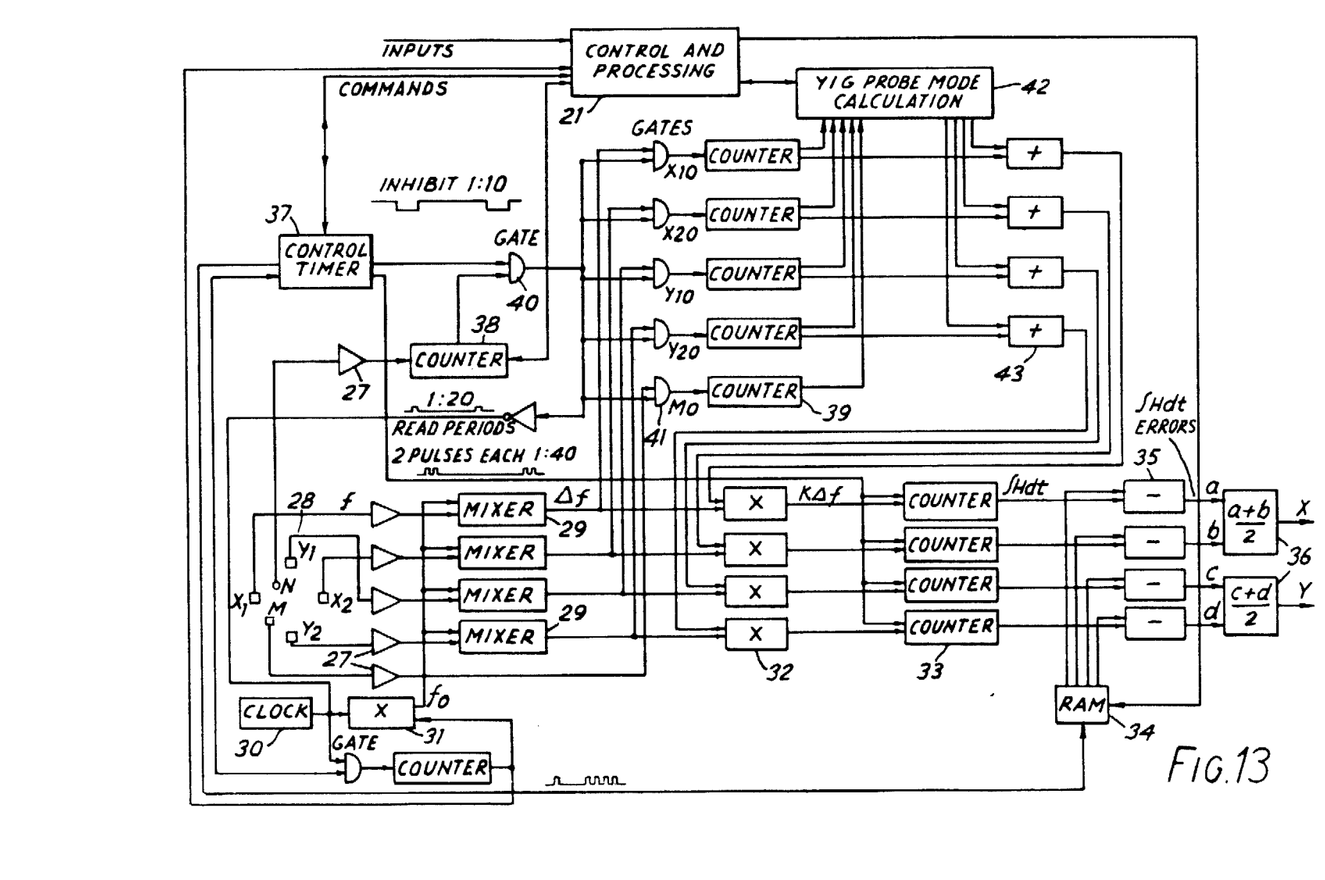
FIG. 13 shows in block diagrammatic form the circuits for deriving required $G_R$ pulse corrections.

There is shown in FIG. 13 a block diagram of the $G_R$ field correction circuits. This diagram also includes certain features which are optional but not essential.

The probe system is shown at 28 essentially as in FIGS. 11 and 12. Each probe supplies its output to a respective probe amplifier 27. The YIG probe signals at frequency f (2.8 $GH_z$ for a 1 $kO_e$ field) are mixed in mixers 29 to bring them to suitable frequencies for counting. Conveniently $f_o$ is chosen so that $\Delta f = f - f_o$ is in the range 150–200 MHz. The signal at $f_o$ is provided from the system clock 30 (a crystal reference clock which may also be clock 8) via a multiplier 31.

The signals at frequency $\Delta f$ on each channel are multiplied by a factor k in multipliers 32. The factor k may include many different corrections as desired. However for the moment the most significant error is that the YIG probes can oscillate in different modes. The factor k is determined to correct for the respective oscillation mode and to produce a signal of frequency which properly represents the field measured.

The frequency $k\Delta f$ is counted in counters 33, over a suitable period, to yield $\int H dt$.

As discussed hereinbefore, the field errors for the $G_x$ and $G_y$ pulses are given by the differences between precalculated and measured field values at the sample times. The precalculated values are held in a RAM (random access memory) 34. This store may be preloaded by any suitable means. In practice, however, the central computer, comprising processing and control 21, is programmed to calculate the required values and they are loaded into RAM 34 from 21. The field errors are then provided by taking the differences in subtractors 35. These differences are calculated for each probe and averaged in units 36 to give X and Y error signals. As discussed hereinbelow, the field correction is by injection into the $G_R$ field coils of currents proportional to X and Y.

Counting in counters 33 is for periods set by the timing control unit 37. This unit takes the output of the system clock 30 and forms control pulses as instructed by the system control 21. A required counting period for the YIG probes can be determined from their characteristics as established. Typically the counting signals are two pulses each 1:40 ratio and closely spaced.

Correction for the different modes of the YIG probes is by use of the NMR probe N with the moving probe M. In an initial procedure before examination begins, counter 38 counts the NMR probe N output with only the $H_{zo}$ field present.

As shown this period is set by control 21 but it could be set by timer 37. One YIG probe is calibrated at one time by moving M adjacent to it to that it experiences the same field as closely as possible.

Then one probe at a time in the same period the counts of the other probes are taken and held in counters/staticisers 39. These are set to the same counting period as counter 38 via gates 40 and 41 which set a window of the NMR probe count. The counts from 29 and 38, the latter via unit 21, are passed to a correction unit 42. This unit determines corrections to be added at 43 to the counts in 39 to give factor k which corrects the YIG probe count to the NMR count. The factor k is a simple correction so the $k\Delta f$ is the count the NMR probe would have given for the same field.

The system as described so far is sufficient to control the $G_R$ vector (although, during a $G_R$ pulse, M is not involved). Preferably the $H_o$ field is maintained sufficiently uniform.

As mentioned hereinbefore the movable NMR probe M is included as part of the setting up procedure with the $H_{zo}$ field only, as the operator places the movable probe successively at the positions of the YIG probes. Thus there is provided not only the count at N, which is as central as possible to the field, but a local NMR count for each YIG count. The local NMR count $M_o$ shows primarily the YIG tuned oscillator characteristics relative to the local field.

It has been mentioned herein that the $G_x$ and $G_y$ pulses could be matched to each other or to a standard. Matching them to each other, however, merely controls the R vector for each $G_R$ pulse. Returning to FIG. 3a it will be remembered that the $G_R$ pulse should inversely match the $G_R$ pulse to give most rapid recovery of the system in period GA. If this time is critical it is desirable that the pulses are matched to a standard which is the same for $G_R$ and $-G_R$. Thus speedy recovery is possible.

Figure 14:
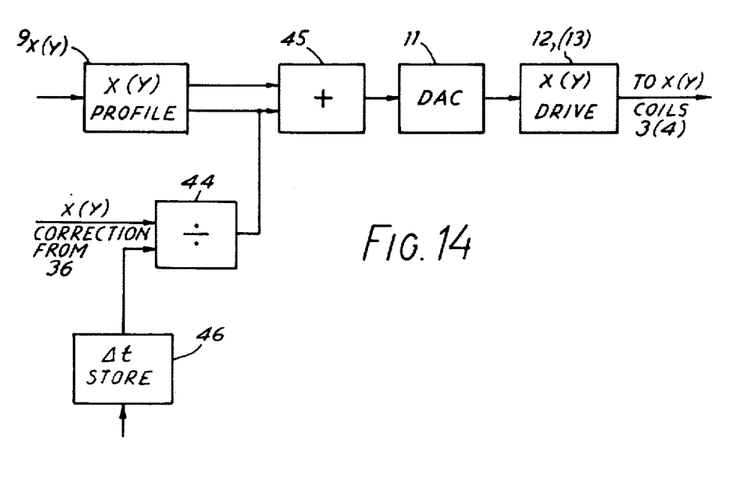
FIG. 14 shows circuits for applying the corrections to the pulse sequence.

The manner of using the X and Y error signals, provided at 36, to control correction of the pulse sequence is shown in FIG. 14. This Figure shows circuits, controlling correction of the $G_x$ pulse but the circuits for $G_y$ are identical and are indicated in parentheses.

The X (or Y) correction signal derived from 36 is applied to a dividing circuit 44 by the sampling duration $\Delta t$, as explained hereinbefore, to derive the required correction current. This is added in summer 45 to the required current derived from profile store 9 and the corrected current valve used as before. As the correction and $\Delta t$ are conveniently provided in digital form the correction is added prior to DAC 11.

Of course, if desired, the correction from 44 may also be used to correct the profile in store 9 if the form of the store 9 so allows.

The value of $\Delta t$ is in this example held in a store 46 in which it is prestored. If the pulse shape used is straightforward the sampling times will be precalculated and therefore known.

If the sampling is more complex, for example as described in copending U.S. application Ser. No. 039,650 then the sampling time may be determined as examination proceeds. In that case $\Delta t$ may be put into store 46 during a pulse cycle as a best estimate for the next one.

What we claim is:

1. A nuclear magnetic resonance apparatus, for examining at least one slice of a body, the apparatus including means for applying magnetic fields to the body to cause resonance preferentially in said slice, means for applying a pulsed magnetic field having a gradient across said at least one slice to produce phase dispersion in said resonance, and means for sensing, during the application of said gradient field, the resonance signal induced, wherein means are provided to cause the gradient field when in use to have a gradient in different directions in the slice at different times by varying proportions of two component magnetic fields with orthogonal gradients, the apparatus further including means for sensing the magnetic fields at a plurality of positions in the plane of the slice, means for deriving therefrom error signals indicative of differences between the fields measured in two orthogonal directions and those fields required to provide the gradient magnetic field of a desired magnitude in a desired direction, and means for using the error signals to adjust the component fields to their required values.

2. An apparatus according to claim 1, in which the means for deriving error signals is arranged to compare one of the component fields with the other of said component fields and the means for using the error signals is arranged to match said component field to the other.

3. An apparatus according to claim 1 in which the means for deriving error signals is arranged to compare each of said component fields with a predetermined standard and the means for using the error signals is arranged to match said component fields to said standard.

4. An apparatus according to any one of claims 1-3 including means arranged to determine the field integrals of said component fields at predetermined intervals and in which the means for deriving error signals is arranged to derive individual error signals for said intervals.

5. An apparatus according to claim 4 in which the intervals are such that the field integrals for each of said intervals are substantially the same for the required values of said fields.

6. An apparatus according to any one of claims 1-3 in which the means for sensing the magnetic fields include YIG tuned oscillators.

7. A medical nuclear magnetic resonance apparatus for examining at least one cross-sectional region of the body of a patient the apparatus including means for applying to the body a steady magnetic field along an axis therein, means for applying a gradient field which, in conjunction with said steady field, gives a predetermined field in said region, means for applying a pulsed periodic magnetic field at the Larmor frequency for the field in said region to cause resonance therein, means for applying a further pulsed magnetic field having a gradient across the region to cause frequency dispersion therein and means for sensing the resonance signal resulting from the region, wherein the means for applying the further magnetic field includes means for causing the further field when in use to have a gradient in different directions in the region at different times by applying varying proportions of component magnetic fields with gradients in substantially orthogonal directions, the apparatus further including means for sensing the magnetic fields at a plurality of positions in the region, means for deriving therefrom error signals indicative of differences between the fields measured in the orthogonal directions and those fields required to provide the further magnetic field of a desired magnitude in the desired direction, and means for using the error signals to adjust the component fields to their required values.

8. A method of examining a body by gyromagnetic resonance, in particular nuclear magnetic resonance, including the steps of: applying magnetic fields to induce resonance preferentially in at least a slice of the body; applying magnetic fields, including a pulsed field having a gradient across the slice in one direction, to cause phase dispersion of said resonance, wherein the pulsed field is caused to have a gradient in different directions in the slice at different times by varying proportions of two component magnetic fields which have field gradients orthogonal to each other and which, together, form said pulsed field; sensing the magnetic fields at a plurality of positions in the plane of the slice; deriving therefrom error signals indicative of differences between the fields measured in two orthogonal directions and those fields required to provide the pulsed magnetic field of the desired magnitude with its gradient in a desired direction; using the error signals to bring the component fields closer to their required values; and sensing the resonance signal resulting from the slice.

9. A method according claim 8 in which the error signals represent deviation of one component field from the required proportion of the other component field for the chosen gradient direction.

10. A method according to claim 8 in which the error signals represent deviation of the component fields from a predetermined standard.

11. A method according to any of claims 8-10 in which the fields are sampled at intervals and used to derive individual error signals for each of said intervals.

12. A method according to any of claims 8-10 in which the fields are sampled at intervals and used to derive error signals which are used to adjust the fields at later times to tend to correct for errors.

13. A method according to either claims 11 or 12 in which the fields are sampled at intervals such that the field integrals in each of those intervals are substantially equal.

14. A method of examining a cross-sectional region of the body of a patient by gyromagnetic resonance, in particular nuclear magnetic resonance, the method including the steps of: applying to the body a steady magnetic field along an axis therein; applying a gradient field which, in conjunction with said steady field gives a predetermined field in said region; applying a periodic magnetic field at the Larmor frequency for the field in said region to cause resonance preferentially therein; applying a further magnetic field having a gradient across the region to cause frequency dispersion in said resonance, wherein the further magnetic field is caused to have gradient in different directions in the slice at different times by varying the proportions of component magnetic fields which have field gradients in substantially orthogonal directions and which, together, form said further field; sensing the magnetic fields at a plurality of positions in the region; deriving therefrom error signals indicative of differences between the fields measured in the orthogonal directions and those fields required to provide the further magnetic field of a desired magnitude in a desired direction; using the error signals to bring the component fields closer to their required values; and sensing the resonance signal resulting from the region.

15. A medical nuclear magnetic resonance apparatus for examining at least one substantially cross-sectional region of the body of a patient, the apparatus including means for applying to the body magnetic fields which cause resonance preferentially in said region, means for applying to the body a plurality of further magnetic fields which have gradients in different directions in the region, means for sensing the resonance signal resulting from the region, which signal includes spatially distinguishable information by virtue of said field gradients, and processing said resonance signal to recover the spatial information and provide an image of said region, wherein the apparatus further includes means for sensing the magnetic fields at a plurality of positions in the region, means for deriving therefrom error signals indicative of differences between the fields measured and those fields required to provide the field gradients of desired magnitudes in desired directions, and means for using the error signals to adjust the magnetic fields to their required values.

16. A method of examining a cross-sectional region of the body of a patient by nuclear magnetic resonance, the method including the steps of: applying to the body magnetic fields which induce resonance preferentially in said region; applying a plurality of further magnetic fields which have gradients in different directions in the region; sensing the resonance signal resulting from the region, the resonance signal including spatially distinguishable information as a result of said field gradients; and processing the resonance signal to recover the spatial information and provide an image of said region; the method further including: sensing the magnetic fields at a plurality of positions in the region; deriving therefrom error signals indicative of differences between the fields measured and those fields required to provide the magnetic field gradients of desired magnitudes and in desired directions; and using the error signals to adjust the field gradients to be closer to the desired values.

* * * * *